US006658614B1

(12) United States Patent
Nagoya (10) Patent No.: US 6,658,614 B1
(45) Date of Patent: Dec. 2, 2003

(54) BOUNDARY SCAN ELEMENT AND COMMUNICATION DEVICE MADE BY USING THE SAME (75) Inventor: Mitsugu Nagoya, 16-9, Akabanenishi 4-chome, Kita-ku, Tokyo 115-0055 (JP)

(73) Assignees: Koken Co., Ltd., Tokyo (JP); Mitsugu Nagoya, Tokyo (JP)

( * ) Notice: Subject to any disclaimer, the term of this patent is extended or adjusted under 35 U.S.C. 154(b) by 0 days.

(21) Appl. No.: 09/424,454
(22) PCT Filed: May 29, 1998
(86) PCT No.: PCT/JP98/02383
§ 371 (c)(1),
(2), (4) Date: Nov. 23, 1999
(87) PCT Pub. No.: WO98/55926
PCT Pub. Date: Dec. 10, 1998

(30) Foreign Application Priority Data

Jun. 2, 1997 (JP) .............................. 9-143804

(51) Int. Cl.$^7$ .............................................. G01R 31/28
(52) U.S. Cl. ..................................................... 714/727
(58) Field of Search ................................ 714/726, 727, 714/729, 724

(56) References Cited

U.S. PATENT DOCUMENTS

| 5,130,988 | A | * | 7/1992 | Wilcox et al. | ............... | 714/727 |
|---|---|---|---|---|---|---|
| 5,132,635 | A | * | 7/1992 | Kennedy | ..................... | 324/763 |
| 5,333,139 | A | * | 7/1994 | Sturges | ........................ | 714/727 |
| 5,450,415 | A | * | 9/1995 | Kamada | ..................... | 714/727 |
| 5,487,074 | A | * | 1/1996 | Sullivan | ..................... | 714/727 |
| 5,488,614 | A | * | 1/1996 | Shima | ......................... | 714/727 |
| 5,544,309 | A | * | 8/1996 | Chang et al. | ................. | 714/30 |
| 5,617,420 | A |   | 4/1997 | Whetsel | ....................... | 370/402 |

FOREIGN PATENT DOCUMENTS

| EP | 0 388 790 | 9/1990 |
|---|---|---|
| JP | 64-68843 | 3/1989 |
| JP | 2-268281 | 11/1990 |
| JP | 4-281691 | 10/1992 |
| JP | 6-300821 | 10/1994 |
| JP | 8-233904 | 9/1996 |
| JP | 9-15299 | 1/1997 |

* cited by examiner

Primary Examiner—Albert Decady
Assistant Examiner—Esaw Abraham
(74) Attorney, Agent, or Firm—Kanesaka & Takeuchi (57) ABSTRACT

There are provided a boundary scan element including a plurality of input-terminal-side boundary cells connected in series and assigned individually to respective input terminals, a plurality of output-terminal-side boundary cells connected in series and assigned individually to respective output terminals, a TAP circuit for controlling input and output of data to or from the input-terminal-side and output-terminal-side boundary cells, a TDI terminal for inputting serial data to be provided to the boundary cells, a TDO terminal for outputting data from the boundary cells as serial data, a TCK terminal to which a clock signal is input, and a TMS terminal to which a mode signal is input to switch an operation mode of the TAP circuit, characterized in that the input-terminal-side boundary cells and the output-terminal-side boundary cells are connected in parallel between the TDI terminal and the TDO terminal; and a communication system using the same.

3 Claims, 9 Drawing Sheets

BOUNDARY SCAN ELEMENT AND COMMUNICATION DEVICE MADE BY USING THE SAME

TECHNICAL FIELD

The present invention relates to a boundary scan element for use in a boundary scan test method and a communication system in which the element is applied to and used as a communication element, and more particularly to a boundary scan element that enables high-speed transfer of data and a communication system using the element.

BACKGROUND OF THE INVENTION

A boundary scan test method has been proposed as one of the inspection methods by which it is tested, with a plurality of IC chips being disposed on a printed wire board with printed wires formed thereon, whether or not the respective IC chips are connected to the respective printed wires correctly and whether or not there is any break in the respective printed wires, etc.

Figure 5:
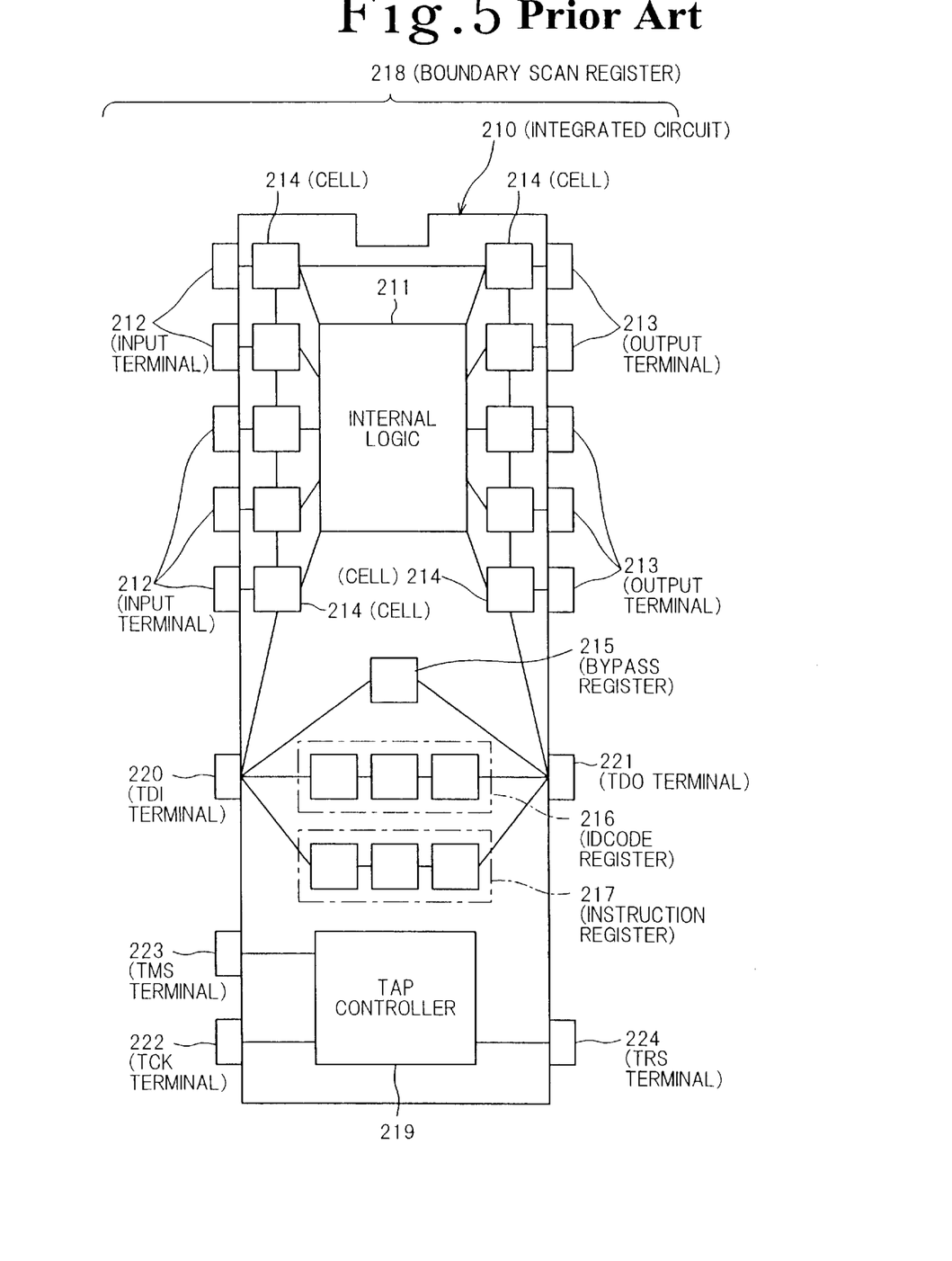
FIG. 5 is a block diagram of a conventional boundary scan element.

This boundary scan test method can be applied to integrated circuits (IC chips) into which boundary scan elements are incorporated. For example, as shown in FIG. 5, the boundary scan element comprises a plurality of boundary cells 214 disposed individually between input/output terminals of an internal logic circuit 211 for implementing the inherent functions of an integrated circuit 210, and input/output terminals 212/213 of the integrated circuit 210, a TAP controller (TAP circuit) 219 for controlling input and output of data to the boundary cells 214, a TDI terminal 220 for receiving test data, a TDO terminal 221 for transmitting test data, a TCK terminal 222 to which a clock signal is input, and a TMS terminal 223 for receiving a mode signal for switching the operation mode of the TAP controller 219. In addition, as required, the boundary scan element is provided with a bypass register 215, and an ID CODE register 216, an instruction register 217, or a TRS terminal 224 for receiving a reset signal. Incidentally, the bypass register 215—the instruction register 217 are designated as a boundary scan register (218).

Explaining the respective terminals and the signals to be input and output at the respective terminals in detail, TDI (Test Data In) is a signal for serial input of commands or data to a test logic, being sampled on the rising edge of TCK. TDO (Test Data Out) is a signal for serial output of data from the test logic, and an output value is changed on the falling edge of TCK. TCK (Test Clock) supplies a clock to the test logic, and is a dedicated input that allows a serial test data path to be used independent of the system clock inherent to the component. TMS (Test Mode Select) is a signal for controlling test operations, being sampled on the rising edge of TCK. The TAP controller decodes this signal. TRST (Test Reset) is a negative logic symbol for initializing the TAP controller in an asynchronous manner and is optional.

The integrated circuit 210 into which such boundary scan elements are incorporated can be tested on the operation conditions thereof and the connections between the integrated circuit 210 and external devices thereof in accordance with the procedures to be mentioned below.

First, to check for a quality of the internal logic 211 of the integrated circuit 210, serial data (test data) is shifted and set to the respective boundary cells 214 corresponding to the respective input terminals 212 while being input to the TDI terminal 220 of the integrated circuit 210. After the integrated circuit 210 is activated under this condition, the data having been set to the respective boundary cells 214 corresponding to the respective output terminals 213 is shifted to be output from the TDO terminal 221. In accordance with the relationship between the resultant serial data (test result data) and the test data input to the integrated circuit 210, it is tested whether or. not the internal logic 211 of the integrated circuit 210 is good.

Furthermore, the boundary scan test method can be applied to a plurality of integrated circuits if boundary scan elements are incorporated therein.

Figure 6:
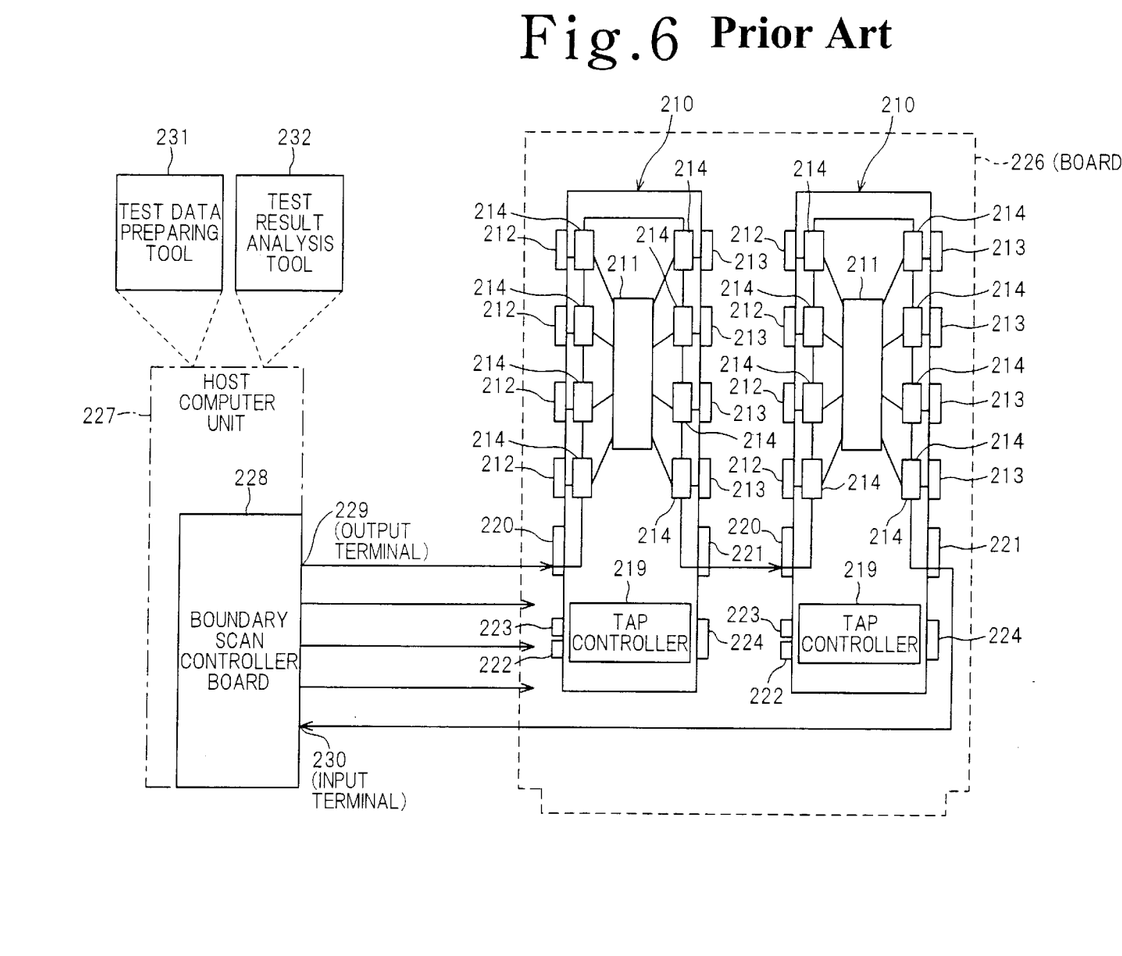
FIG. 6 is a block diagram showing an example of a boundary scan test using the boundary scan element shown in FIG. 5.

For example, for a plurality of integrated circuits 210 mounted on the board 226 as shown in FIG. 6, the integrated circuits 210 can be tested on themselves in conjunction with a test on a break in printed patterns between the integrated circuits 210.

In this case, the respective boundary scan elements incorporated into the plurality of integrated circuits 210 are connected in series. Specifically, the TDO terminal 221 of a first integrated circuit 210 (on the left in the figure) is connected to the TDI terminal 220 of a second integrated circuit 210 (on the right in the figure). Furthermore, the output terminal 229 of the boundary scan controller board 228 provided in the host computer unit 227 or the like is connected to the TDI terminal 220 of the first integrated circuit 210. Still furthermore, the input terminal 230 of the boundary scan controller board 228 is connected to the TDO terminal 221 of the second integrated circuit 210. The test procedure is as follows.

Figure 7:
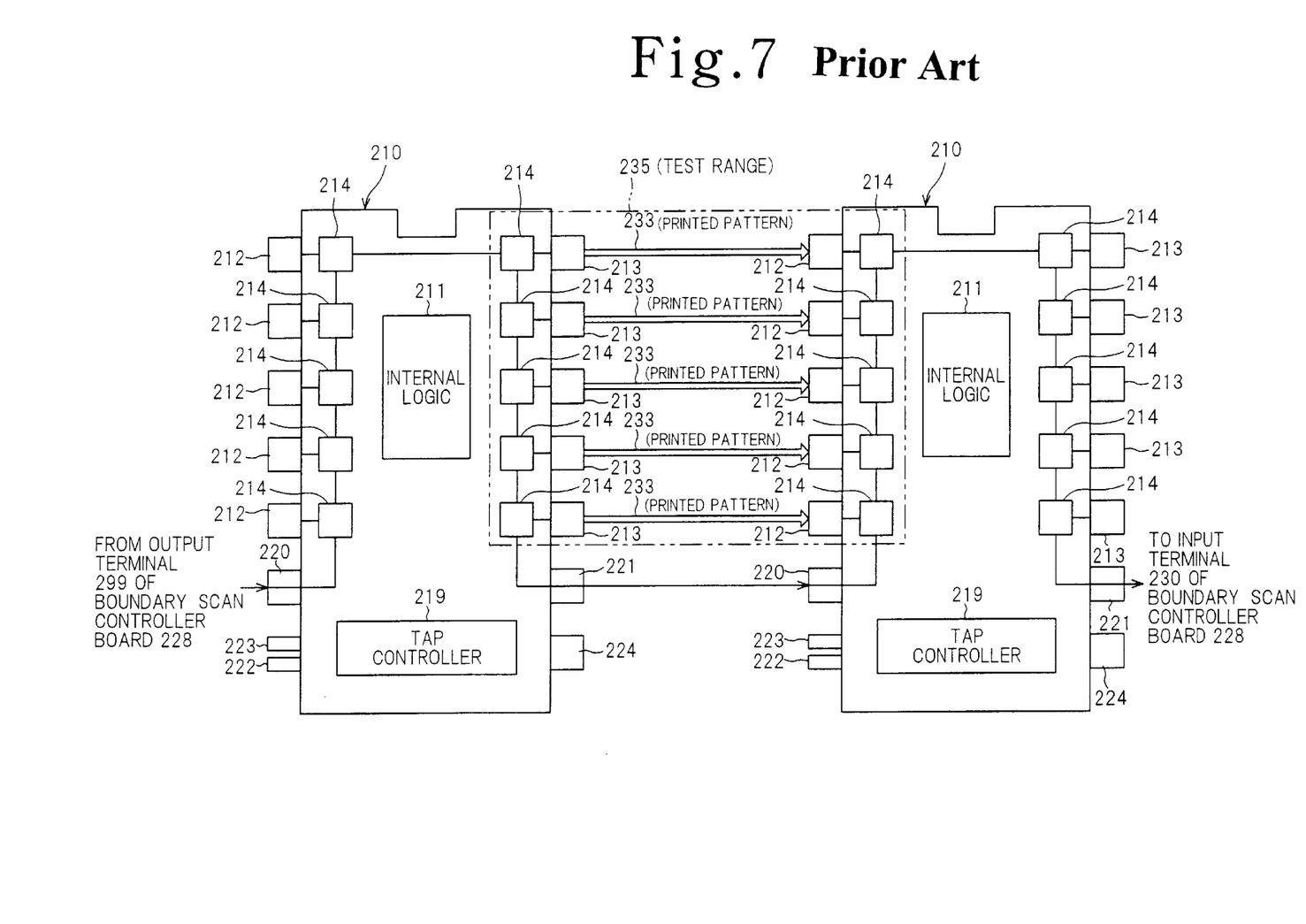
FIG. 7 is a schematic diagram showing an example of a boundary scan test using the boundary scan element shown in FIG. 5.

In the case of testing a break, short-circuit, or the like in printed patterns, test data (serial data) is prepared using a test data preparing tool 231 or the like, and then output from the output terminal 229 of the boundary scan controller board 228. Then, while being input to the TDI terminal 220 of the first integrated circuit 210, the data is shifted and set to the respective boundary cells 214 corresponding to the respective output terminals 213 of the integrated circuit 210. Under this condition, the data stored in these respective boundary cells 214 is output from the respective output terminals 213 provided on the first integrated circuit 210 as shown in FIG. 7. Additionally, the data is input to the respective input terminals 212 of the second integrated circuit 210 via respective printed patterns 233 constituting a system bus or the like, and furthermore captured by the respective boundary cells 214 corresponding to these respective input terminals 212.

Thereafter, the data stored in the respective boundary cells 214 of these respective integrated circuits 210 is shifted, and analyzed using the test result analysis tool 232 while being captured by the input terminal 230 of the boundary scan controller board 228. This allows a test on the break, short-circuit and the like within the test range 235 of the printed pattern 233 that connects between the integrated circuits 210.

Now, in the case of testing the internal logic 211 of the respective integrated circuits 210, test data is output from the output terminal 229 of the boundary scan controller board 228. Then, while being input to the TDI terminal 220 of the first integrated circuit 210, the data is shifted and set to the respective boundary cells 214 corresponding to the respective input terminals 212 of the integrated circuit 210 as shown in FIG. 8.

Subsequently, the integrated circuit 210 is activated and the respective boundary cells 214 corresponding to the respective output terminals 213 are allowed to capture the resultant data. Thereafter, the data stored in these respective boundary cells 214 is shifted and output from the TDO terminal 221 of the first integrated circuit 210. At this time, the boundary scan controller board 228 drives the second integrated circuit 210 into a bypass state as shown in FIG. 7. This allows the data output from the TDO terminal 221 to bypass the second integrated circuit 210 and to be captured by the input terminal 230 of the boundary scan controller board 228. Additionally, the test analysis tool 232 or the like is used to analyze the captured data, thereby allowing a test on whether or not the first integrated circuit 210 operates properly.

Figure 8:
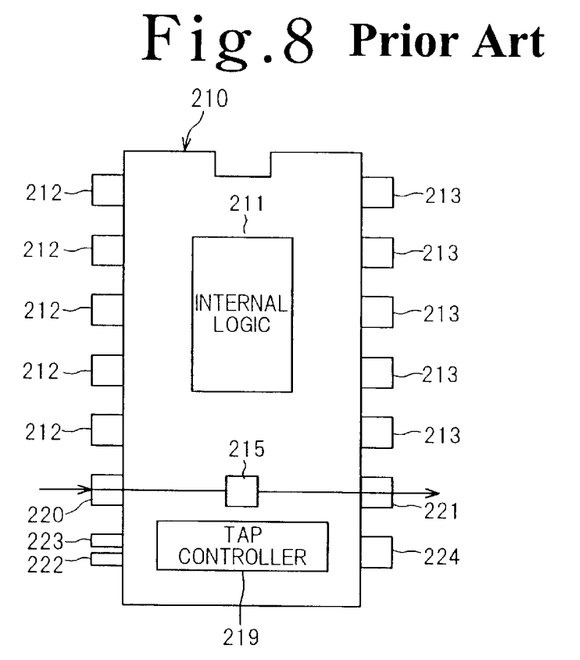
FIG. 8 is a schematic diagram showing an example of a boundary scan test using the boundary scan element shown in FIG. 5.
Figure 9:
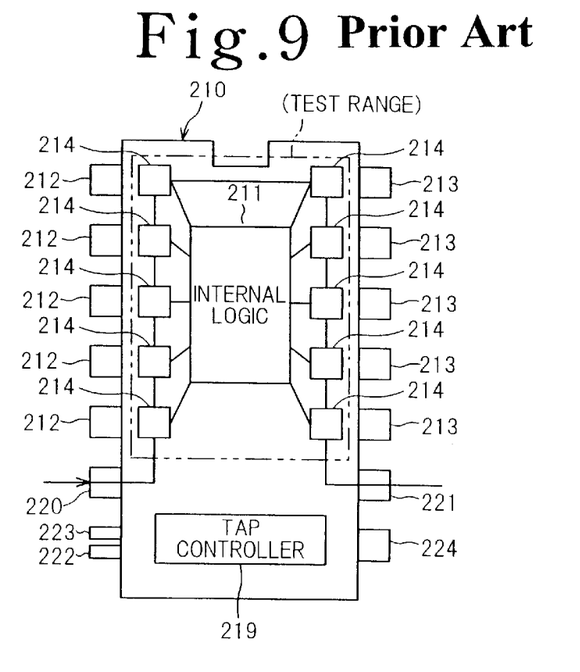
FIG. 9 is a schematic diagram showing an example of a boundary scan test using the boundary scan element shown in FIG. 5.

Now, in the case of testing the second integrated circuit 210, in a like manner, the boundary scan controller board 228 drives the first integrated circuit 210 into a bypass state as shown in FIG. 8. Thereafter, test data is output from the output terminal 229 of the boundary scan controller board 228 and is allowed to bypass the first integrated circuit 210. Then, while being input to the TDI terminal 220 of the second integrated circuit 210, the test data is shifted and set to the respective boundary cells 214 corresponding to the respective input terminals 212 of the second integrated circuit 210 as shown in FIG. 9. Subsequently, this integrated circuit 210 is activated, and the respective boundary cells 214 corresponding to the respective output terminals 213 are allowed to capture the resultant data. Thereafter, the data stored in the respective boundary cells 214 is shifted to be output from the TDO terminal 221 and further captured by the input terminal 230 of the boundary scan controller board 228. Then, the test result analysis tool 232 or the like is used to analyze the captured data, thereby allowing a test on whether or not the second integrated circuit 210 operates properly.

As mentioned above, such a board 226 that uses integrated circuits 210 into which boundary scan elements are incorporated can be tested on a quality of the respective integrated circuits 210 themselves and connections between the integrated circuits 210 by applying the boundary scan test method.

Incidentally, when the inventor constructed a sensor module board and the like using integrated circuits into which such boundary scan elements were incorporated, the inventor has discovered that the input and output of serial data can be performed with the respective integrated circuits mounted on the board 226 at a rate on the order of 20 Mbps without using communication integrated circuits.

Then, the inventor has proposed a communication system to which boundary scan elements are applied and which allows for communicating with a host computer or the like without using a communication device.

Figure 10:
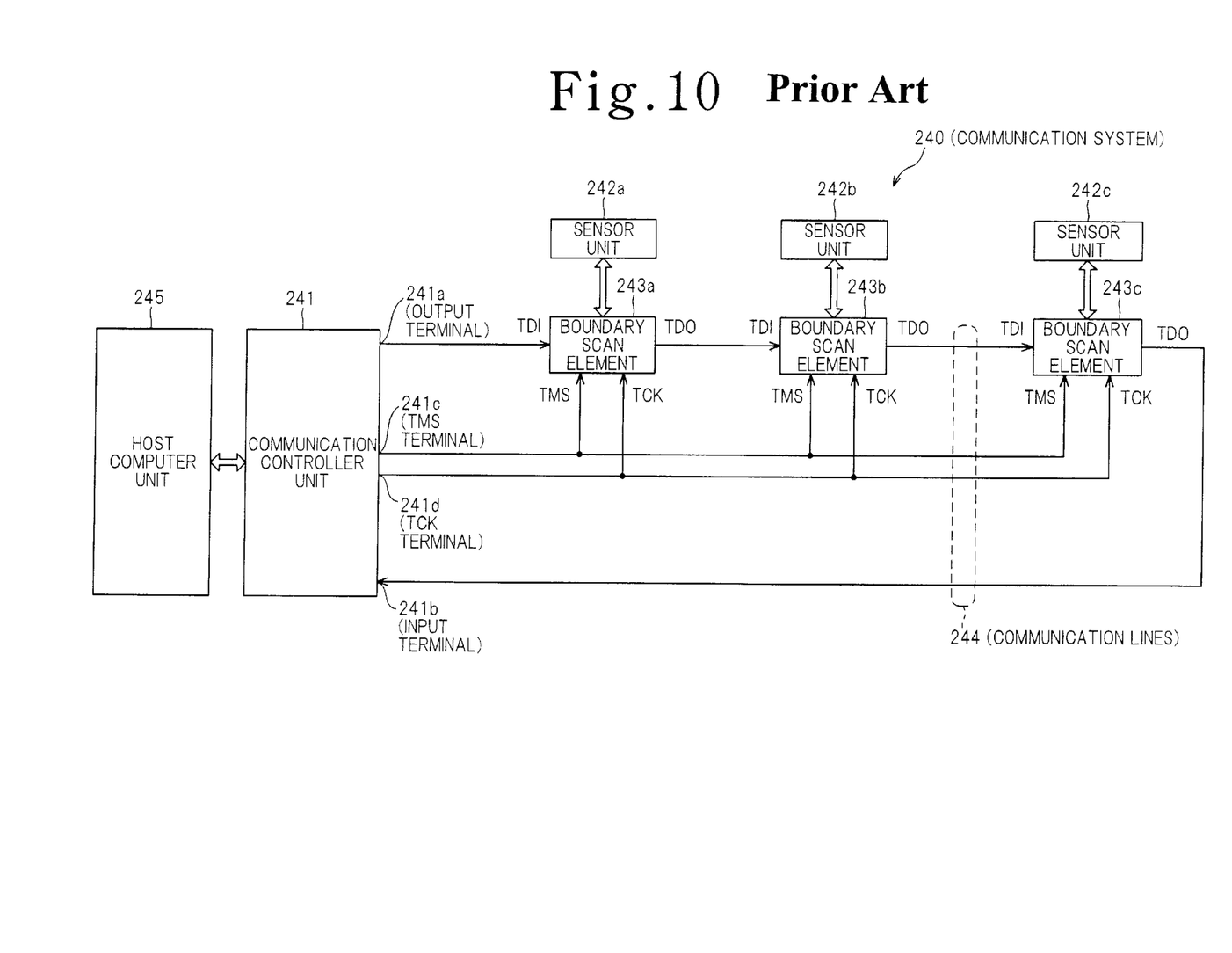
FIG. 10 is a block diagram showing an example of a conventional communication system to which boundary scan elements are applied.

FIG. 10 is a block diagram showing an example of a communication system to which boundary scan elements are applied.

The communication system 240 shown in the figure includes a communication controller unit 241 for transmitting and collecting communication data, and the like, a plurality of sensor units 242a–242c for monitoring a target object to be monitored, and the like, a plurality of boundary scan elements 243a–243c being disposed for the respective sensor units 242a–242c and performing such processing as capturing the control data output from the communication controller 241 and then supplying the data to the respective sensor units 242a–242c, and as capturing detection data or the like to be output from these respective sensor units 242a–242c and then supplying the data to the communication controller 241, and communication lines 244 for connecting these respective boundary scan elements 243a–243c to said communication controller unit 241.

The respective boundary scan elements 243a–243c are connected in series to the communication controller unit 241. Specifically, the output terminal 241a of the communication controller unit 241 is connected to the TDI terminal of the boundary scan element 243a, the TDO terminal of the boundary scan element 243a is connected to the TDI terminal of the subsequent boundary scan element 243b, and so on. The TDO terminal of the boundary scan element 243c is connected to the input terminal 241b of the communication controller unit 241.

The action of the communication system 240 is as follows.

The respective boundary scan elements 243a–243c are allowed to function in synchronization with the clock signal to be transmitted from the TCK terminal 241d of the communication controller unit 241. In addition, the TMS signal to be transmitted from the TMS terminal 241c of the communication controller unit 241 switches the operation mode of the respective TAP controllers.

Then, in the case of driving the respective sensor units 242a–242c in accordance with the instruction from the host computer unit 245, control data (serial data) is output from the output terminal 241a of the communication controller unit 241. Then, the data is supplied to the respective boundary scan elements 243a–243c and set to the boundary cells corresponding to the output terminals. Then, the control data thus set is output from the output terminals and supplied to the respective sensor units 242a–242c corresponding to the respective boundary scan elements 243a–243c to drive them.

Furthermore, in the case of collecting detection data or the like from the respective sensor units 242a–242c in accordance with the direction form the host computer unit 245, the detection data or the like of the respective sensor units 242a–242c is once set to the boundary cells corresponding to the input terminals of the corresponding respective boundary scan elements 243a–243c. Then, the data is output as serial data from the TDO terminal and captured at the input terminal 241b of the communication controller unit 241.

Such communication system 240 allows its data transfer rate to be 20 Mbps at the maximum and thus enables transferring of communication data at a higher transfer rate than by means of a prior-art communication system in the case of setting control data to the respective boundary scan elements 243a–243c or in the case of allowing the respective boundary scan elements 243a–243c to output detection data or the like.

On the other hand, since the prior-art boundary scan element has all boundary cells connected in series between the TDI and TDO terminals even, for example, in the case of setting data only to the boundary cells assigned to the output terminals, the data had to be shifted in sequence from the boundary cells assigned to the input terminals in some cases.

This prevents the time for executing the boundary scan test method from being shortened and high-speed transfer of data in the case of applying boundary scan elements to communication elements as the inventor did.

DISCLOSURE OF THE INVENTION

An object of the present invention is to provide a boundary scan element and a communication system employing the same, which enables high-speed transfer of data to boundary cells.

According to the present invention, there is provided a boundary scan element comprising a plurality of inputterminal-side boundary cells connected in series and assigned individually to respective input terminals, a plurality of output-terminal-side boundary cells connected in series and assigned individually to respective output terminals, a TAP circuit for controlling input and output of data to or from the aforesaid input-terminal-side and output-terminal-side boundary cells, a TDI terminal for inputting serial data to be provided to the aforesaid boundary cells, a TDO terminal for outputting data from the aforesaid boundary cells as serial data, a TCK terminal to which a clock signal is input, and a TMS terminal to which a mode signal is input to switch an operation mode of the aforesaid TAP circuit, wherein the aforesaid input-terminal-side boundary cells and the aforesaid output-terminal-side boundary cells are connected in parallel between the aforesaid TDI terminal and the aforesaid TDO terminal.

In the present invention, all boundary cells are not connected in series as in the prior art, but the input-terminal-side boundary cells assigned to the input terminals and the output-terminal-side boundary cells assigned to the output terminals are connected in parallel between the TDI terminal and the TDO terminal.

Therefore, for example, in the case where data from the TDI terminal is set to the output-terminal-side boundary cells, it is made possible to transfer the data directly to the output-terminal-side boundary cells without passing through the input-terminal-side boundary cells, so that high-speed transfer of test data or the like to boundary cells can be implemented.

Furthermore, the boundary scan element of the present invention can be also configured in such a manner that two of each of the TDI terminal and the TDO terminal are provided, the input-terminal-side boundary cells are connected between either one of the TDI terminals and either one of the TDO terminals, and the output-terminal-side boundary cells are connected between the other one of the TDI terminals and the other one of the TDO terminals.

Such configuration enables simultaneous transfer of data to both the input-terminal-side boundary cells and the output-terminal-side boundary cells, thereby enabling further improvement in high-speed transfer of test data or the like to boundary cells.

In the foregoing, the boundary scan element of the present invention may be either encapsulated in an independent single package itself or incorporated into other IC.

Furthermore, when the boundary scan element is encapsulated in an independent package, the input and output terminals mean the input and output terminals thereof. When it is incorporated into other IC, they mean the input and output terminals of the IC.

Now, according to the present invention, there is provided a communication system comprising boundary scan elements each having a plurality of input-terminal-side boundary cells connected in series and assigned individually to respective input terminals, a plurality of output-terminal-side boundary cells connected in series and assigned individually to respective output terminals, a TAP circuit for controlling input and output of data to or from the aforesaid input-terminal-side and output-terminal-side boundary cells, a TDI terminal for inputting serial data to be provided to the aforesaid boundary cells, a TDO terminal for outputting data from the aforesaid boundary cells as serial data, a TCK terminal to which a clock signal is input, and a TMS terminal to which a mode signal is input to switch an operation mode of the aforesaid TAP circuit; a plurality of terminal devices respectively connected to the aforesaid boundary scan elements or having an IC into which the elements are incorporated; and a communication controller to which the aforesaid boundary scan elements are connected in series and which transmits and receives communication date for controlling the aforesaid terminal devices individually via the aforesaid boundary scan elements, wherein each of the aforesaid boundary scan elements has the aforesaid input-terminal-side boundary cells and the aforesaid output-terminal-side boundary cells connected in parallel between the aforesaid TDI terminal and the aforesaid TDO terminal.

The communication system of the present invention employs the boundary scan elements as communication elements in order to control the terminal devices by means of the communication controller.

That is, in the case of transferring communication data to the terminal devices, the communication data is once transferred from the communication controller to the output-terminal-side boundary cells of the boundary scan elements, and thereafter the communication data is transmitted from the boundary scan elements to the terminal devices. On the other hand, in the case of receiving communication data from the terminal devices, the communication data is once transferred from the terminal devices to the input-terminal-side boundary cells of the boundary scan elements, and thereafter the communication data is transmitted from the boundary scan elements to the communication controller.

In addition, since the boundary scan elements have the input-terminal-side boundary cells and output-terminal-side boundary cells connected in parallel between the TDI terminal and the TDO terminal, communication data can be directly transferred to the respective-terminal-side boundary cells via the TDI terminal and the TDO terminal.

Therefore, communication data can be transferred at a greater transfer rate than by means of a communication system employing prior-art boundary scan elements in which all boundary cells are connected in series.

Furthermore, according to the present invention, there is provided a communication system comprising boundary scan elements each having a plurality of input-terminal-side boundary cells connected in series and assigned individually to respective input terminals, a plurality of output-terminal-side boundary cells connected in series and assigned individually to respective output terminals, a TAP circuit for controlling input and output of data to or from the aforesaid input-terminal-side and output-terminal-side boundary cells, TDI terminals for inputting serial data to be provided to the aforesaid boundary cells, TDO terminals for outputting data from the aforesaid boundary cells as serial data, a TCK terminal to which a clock signal is input, and a TMS terminal to which a mode signal is input to switch an operation mode of the aforesaid TAP circuit; a plurality of terminal devices connected to the aforesaid respective boundary scan elements or having an IC into which the elements are incorporated, and a communication controller to which the aforesaid boundary scan elements are connected in series and which transmits and receives communication date for controlling the aforesaid terminal devices individually via the aforesaid boundary scan elements; wherein the aforesaid TDI terminals and the aforesaid TDO terminal of each of the aforesaid boundary scan elements comprise a first TDI terminal and a first TDO terminal connected respectively to opposite ends of the aforesaid input-terminal-side boundary cells, and a second TDI terminal and a second TDO terminal connected respectively to opposite ends of the aforesaid output-terminal-side boundary cells, that the aforesaid second TDI terminal of either one of the aforesaid boundary scan elements located on both ends is connected with a data output terminal of the aforesaid communication controller and the aforesaid first TDO terminal thereof is connected with a data input terminal of the aforesaid communication controller, and that the aforesaid second TDO terminal and the aforesaid first TDI terminal of the other one of the aforesaid boundary scan elements are connected.

The communication system of the present invention employs, as communication elements, the boundary scan elements mentioned above in order to control the terminal devices by means of the communication controller.

That is, the TDI terminal and the TDO terminal of the boundary scan elements comprise a first TDI terminal and a first TDO terminal connected respectively to opposite ends of the input-terminal-side boundary cells, and a second TDI terminal and a second TDO terminal connected respectively to opposite ends of the output-terminal-side boundary cells; thereby enabling simultaneous transfer of mutually different communication data to the input-terminal-side and output-terminal-side boundary cells, and enabling communication data to be transferred at a still higher transfer rate than by means of the communication system of the present invention mentioned above.

The communication system of the present invention may employ various sensor units, for example, monitoring cameras or the like as the aforesaid terminal devices. In addition, concerning the connection between the terminal devices and the boundary scan elements, the output terminals are connected to the input terminals of the terminal devices and the input terminals are connected to the output terminals of the terminal devices respectively, thereby allowing data of the boundary cells to be output to the terminal devices, and conversely, the data to be input to the boundary cells.

The aforesaid communication data include, in addition to control data transmitted to the terminal devices to control the same, the data detected by the terminal devices transmitted by the aforesaid terminal devices, and status data indicating whether or not the terminal devices are being operated normally, and the like.

BEST MODE FOR CARRYING OUT THE INVENTION

Contents of First Embodiment

Figure 1:
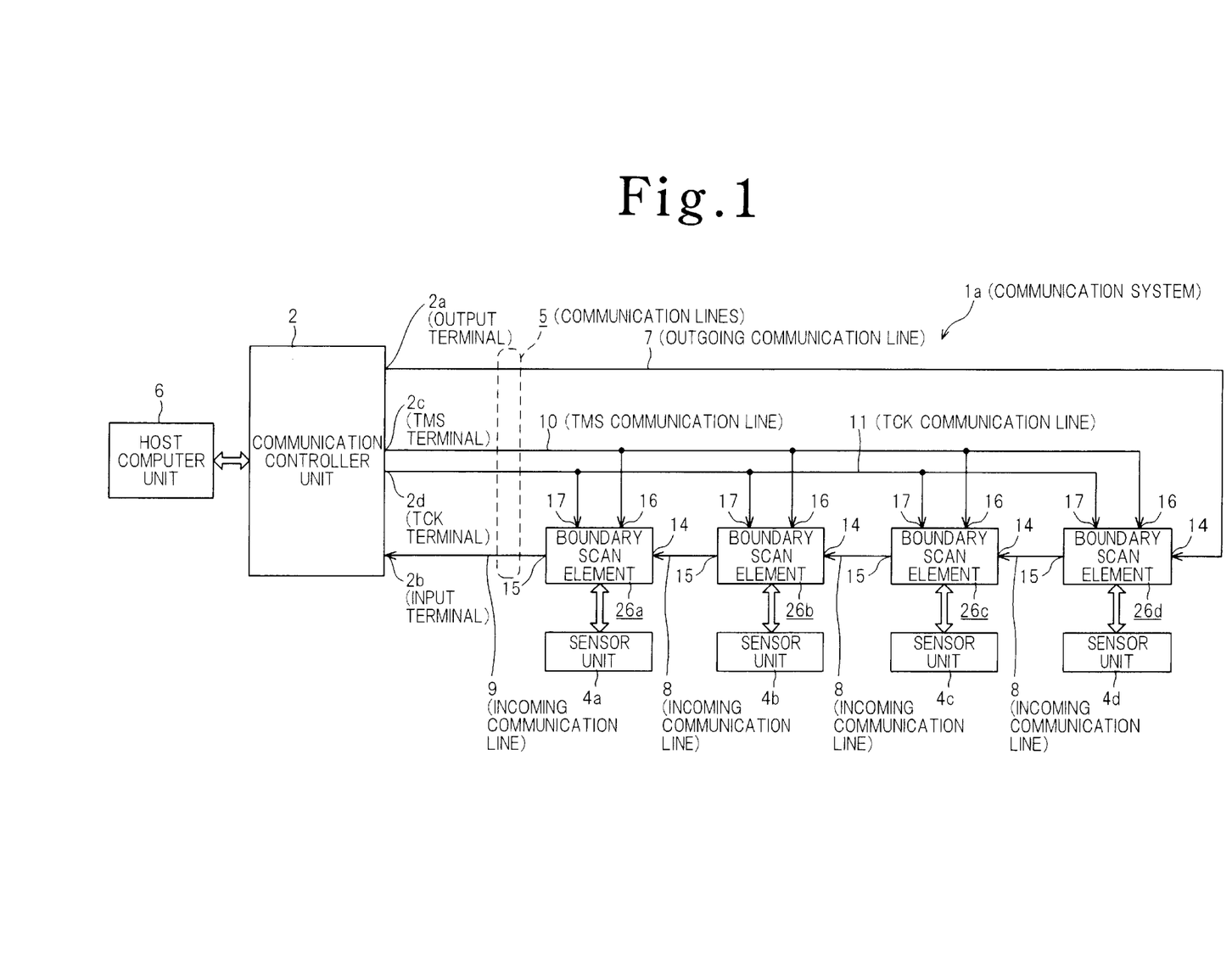
FIG. 1 is a block diagram showing a first embodiment of a communication system. of the present invention.

FIG. 1 is a block diagram showing a communication system 1a of the present invention.

The communication system 1a includes a plurality of boundary scan elements 26a–26d of the present invention, sensor units (terminal devices) 4a–4d connected to the respective boundary scan elements 26a–26d, and a communication controller unit 2 for controlling the sensor units 4a–4d via the boundary scan elements 26a–26d. Further, the communication controller unit 2 is connected with a host computer unit 6.

Figure 2:
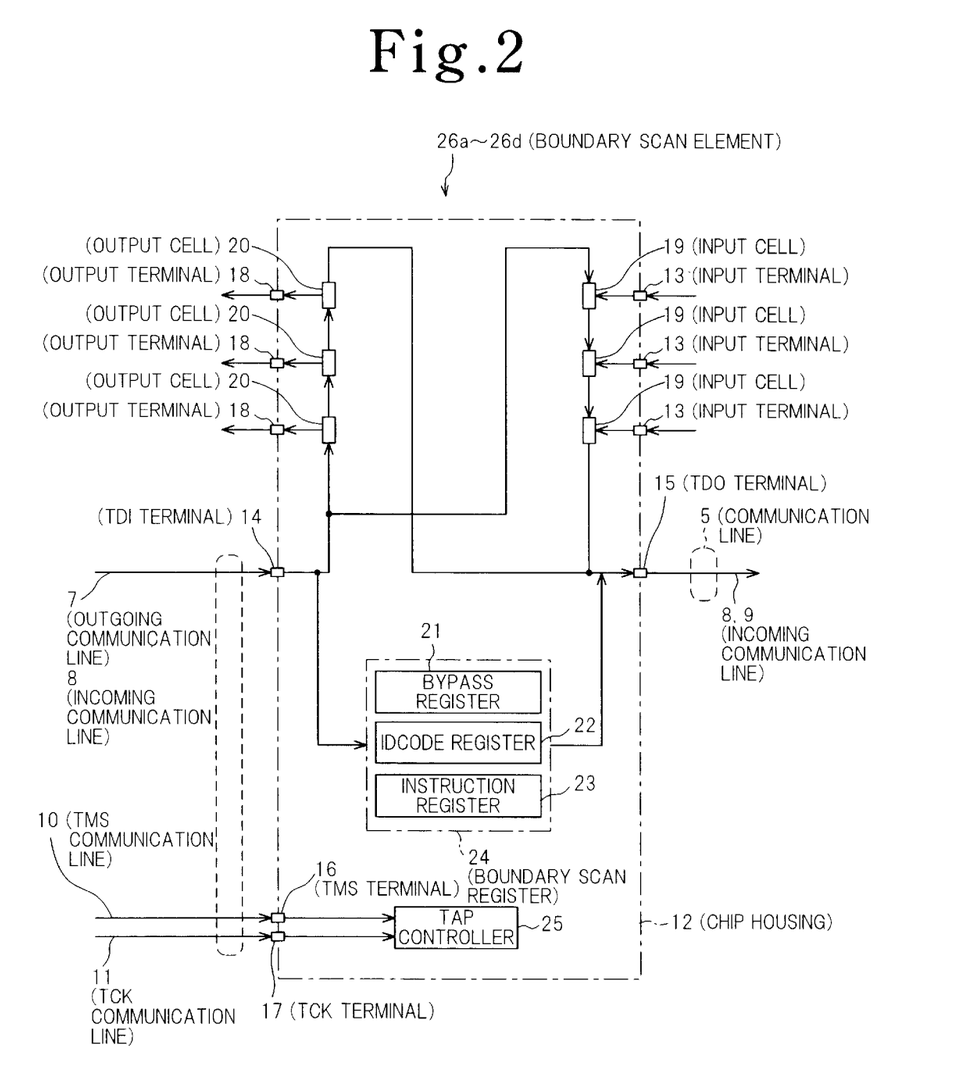
FIG. 2 is a block diagram of a boundary scan element 26a–26d.

As shown in FIG. 2, each of the boundary scan elements 26a–26d is incorporated into a chip housing 12 as a single package and, like the conventional boundary scan element shown in FIG. 5, includes boundary cells 19 and 20, a TAP controller 25 for controlling input and output of data to or from the boundary cells 19 and 20, a TDI terminal 14 for receiving serial data, a TDO terminal 15 for transmitting serial data, a TCK terminal 17 to which a clock signal is input, and a TMS terminal 16 for receiving a mode signal for switching the operation mode of the TAP controller 25, and is further provided with a bypass register 21, an ID CODE register 22, and an instruction register 23 (a boundary scan register 24) and the like as required. Incidentally, the bypass register 21 is to transfer communication data without passing through the boundary cells. The ID CODE register 22 is to identify where communication data comes from by outputting ID CODE attached individually thereto. Furthermore, the instruction register 23 is to decode specific data among communication data to shift operation modes or the like independent of the TMS signal.

However, the boundary scan elements 26a–26d are configured in a manner such that all of the boundary cells 19 and 20 are not connected in series but divided into the output cells (output-side boundary cells) 20 and the input cells (input-side boundary cells) 19 corresponding to output terminals 18 and input terminals 13, respectively, which are provided outside the chip housing 12. Moreover, the input cells 19 and the output cells 20 are respectively connected in series, and connected in parallel between the TDI terminal 14 and the TDO terminal 15.

Furthermore, as a special operation, the boundary scan elements 26a–26d have an operation mode in which only either of the input cells 19 or the output cells 20 are driven into an operating state and the other are driven into a non-operating state.

With such structure, in the case where communication data is transferred to either one of input cells 19 or output cells 20, the communication data need not be shifted to the other cells but can be directly transferred.

Such boundary scan elements 26a–26d are connected in series to the communication controller unit 2.

Specifically, the output terminal 2a of the communication controller unit 2 is connected to the TDI terminal 14 of the boundary scan element 26d by an outgoing communication line 7, while the TDO terminal 15 of the boundary scan element 26d is connected to the TDI terminal 14 of the subsequent boundary scan element 26c by an incoming communication line 8. Similarly, the incoming communication line 8 connects between the boundary scan elements 26c and 26b, and between the boundary scan elements 26b and 26a. Then, finally, the TDO terminal 15 of the boundary scan element 26a is connected to an input terminal 3b of the communication controller unit 2 via an incoming communication line 9.

Therefore, communication data given to the boundary scan elements 26a–26d or communication data output from the boundary scan elements 26a–26d is always transferred in the direction from the boundary scan element 26d to 26a.

Incidentally, the communication controller unit 2 and the boundary scan elements 26a–26d may be connected totally in the reversed manner. That is, the output terminal 2a of the communication controller unit 2 may be connected to the TDI terminal 14 of the boundary scan element 26a and an input terminal 2b may be connected to the TDO terminal 15 of the boundary scan element 26d, while the TDI terminal and the TDO terminal between the respective boundary scan elements may be connected. In this case, data is transferred in the direction opposite to that mentioned above.

Furthermore, the TCK terminal or the TMS terminal of the respective boundary scan elements 26a–26d is supplied with a clock signal or a mode signal from the communication controller unit 2, respectively. This allows the respective boundary scan elements 26a–26d to function in a synchronous manner.

The input terminals 13 and the output terminals 18 of the boundary scan elements 26a–26d are connected to output terminals and input terminals (not shown) of the corresponding sensor units 4a–4d, respectively. Control data set to the output cells 20 is transmitted to the input terminals of the sensor units 4a–4d and detection data or the like obtained by the sensor units 4a–4d is transmitted from the output terminals to the input cells 19.

The sensor units 4a–4d are disposed at positions corresponding to a target object to be monitored, and includes various sensors for measuring temperature, pressure or the like, or a monitoring circuit for monitoring the operating conditions of a CPU circuit, a target for monitoring. Then, in accordance with the measuring conditions or monitoring conditions specified by the control data or the like given via the boundary scan elements 26a–26d, the sensor units execute measuring operation or monitoring operation and transmit as well the resultant measurements or results given by the monitoring or the like to the communication controller unit 2 via the boundary scan elements 26a–26d.

The communication controller unit 2 includes a hardware circuit or a microprocessor circuit and transmits a signal, necessary for driving the boundary scan elements 26a–26d, from a TMS terminal 2c and a TCK terminal 2d in accordance with the contents of the directions output by the host computer unit 6. Moreover, the controller unit performs processing such as transmitting data for controlling the sensor units 4a–4d from the output terminal 2a to a communication line 5 and receiving further from the input terminal 2b the data obtained by the sensor units 4a–4d and then supplying the data to the host computer unit 6.

Now, the action of the communication system 1a configured in this manner will be explained.

Transmission of a command for driving the sensor units 4a–4d from the host computer unit 6 causes the communication controller unit 2 to prepare control data in response to the command. Then, the communication controller unit 2 transmits the mode signal from the TMS terminal 2c to switch the respective boundary scan elements 26a–26d to the operation mode required, and as well transmits the control data to the outgoing communication line 5, thereby allowing the control data to be set to the output cells 20 of the respective boundary scan elements 26a–26d. At this time, since the control data can be directly transferred from the TDI terminal 14 of each of the boundary scan elements 26a–26d to the output cells 20, the transfer time is short.

Subsequently, the communication controller unit 2 outputs a mode signal indicating an output command for the control data from the TMS terminal 2c, thereby allowing the control data set to the output cells 20 of the respective boundary scan elements 26a–26d to be transmitted to the corresponding sensor units 4a–4d.

The sensor units 4a–4d execute the measuring operation or monitoring operation in response to the contents of the control data received. Additionally, in accordance with the contents of the control data, the sensor units output measurement data, monitor data, or status data dr the like of the sensor units 4a–4d themselves to the corresponding boundary scan elements 26a–26d.

Subsequently, transmission of a command for collecting the measurement data or the like of the sensor units 4a–4d from the host computer unit 6 will cause the communication controller unit 2 to transmit the mode signal from the TMS terminal 2c to switch the respective boundary scan elements 26a–26d to the operation mode required. This allows detection data or the like such as measurement data to be set from the sensor units 4a–4d to the corresponding input cells 19 of the respective boundary scan elements 26a–26d. Then, the communication controller unit 2 outputs the mode signal indicating a transfer command for communication data from the TMS terminal 2c. This causes detection data or the like set to the input cells 19 of the respective boundary scan elements 26a–26d to be transferred to the communication controller unit 2. At this time, since the detection data or the like set to the input cells 19 is directly shifted to the TDO terminal 15 of each of the boundary scan elements 26a–26d, the transfer time is short.

Thereafter, the host computer unit 6 or the communication controller unit 2 will perform analysis of the detection data received or the like.

As mentioned above, the communication system 1a of the present invention employs the boundary scan elements 26a–26d of the present invention, thereby enabling the transfer rate of communication data to be improved.

Contents of Second Embodiment

Figure 3:
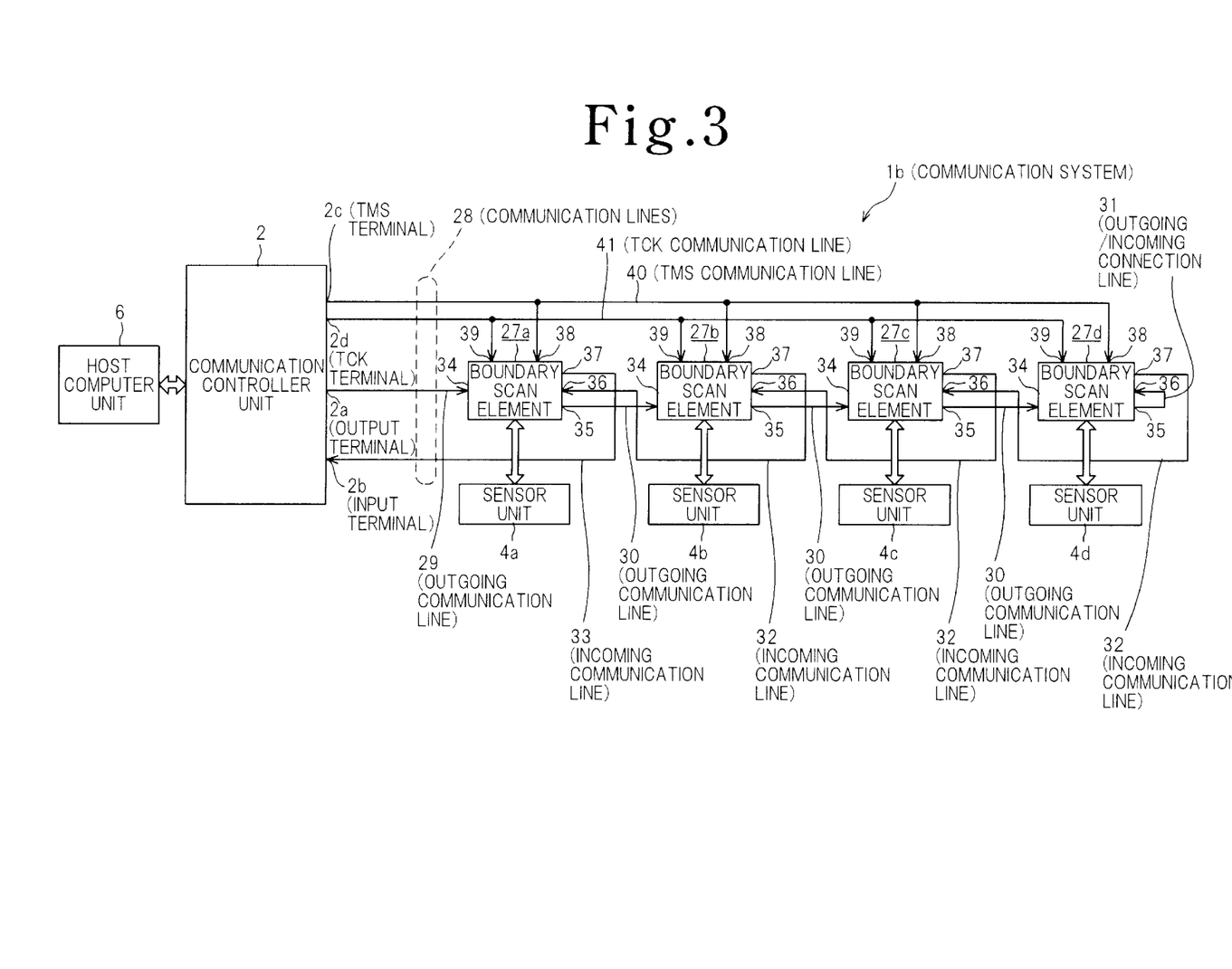
FIG. 3 is a block diagram showing a second embodiment of a communication system of the present invention.

FIG. 3 is a block diagram showing another communication system 1b of the present invention, wherein the parts corresponding to those of the communication system 1a of FIG. 1 are alloted the same symbols in FIG. 1.

The communication system 1b includes a plurality of boundary scan elements 27a–27d of the present invention, sensor units (terminal devices) 4a–4d connected to the respective boundary scan elements 27a–27d, and a communication controller unit 2 for controlling the sensor units 4a–4d via the boundary scan elements 27a–27d. Further, the communication controller unit 2 is connected with a host computer unit 6.

Figure 4:
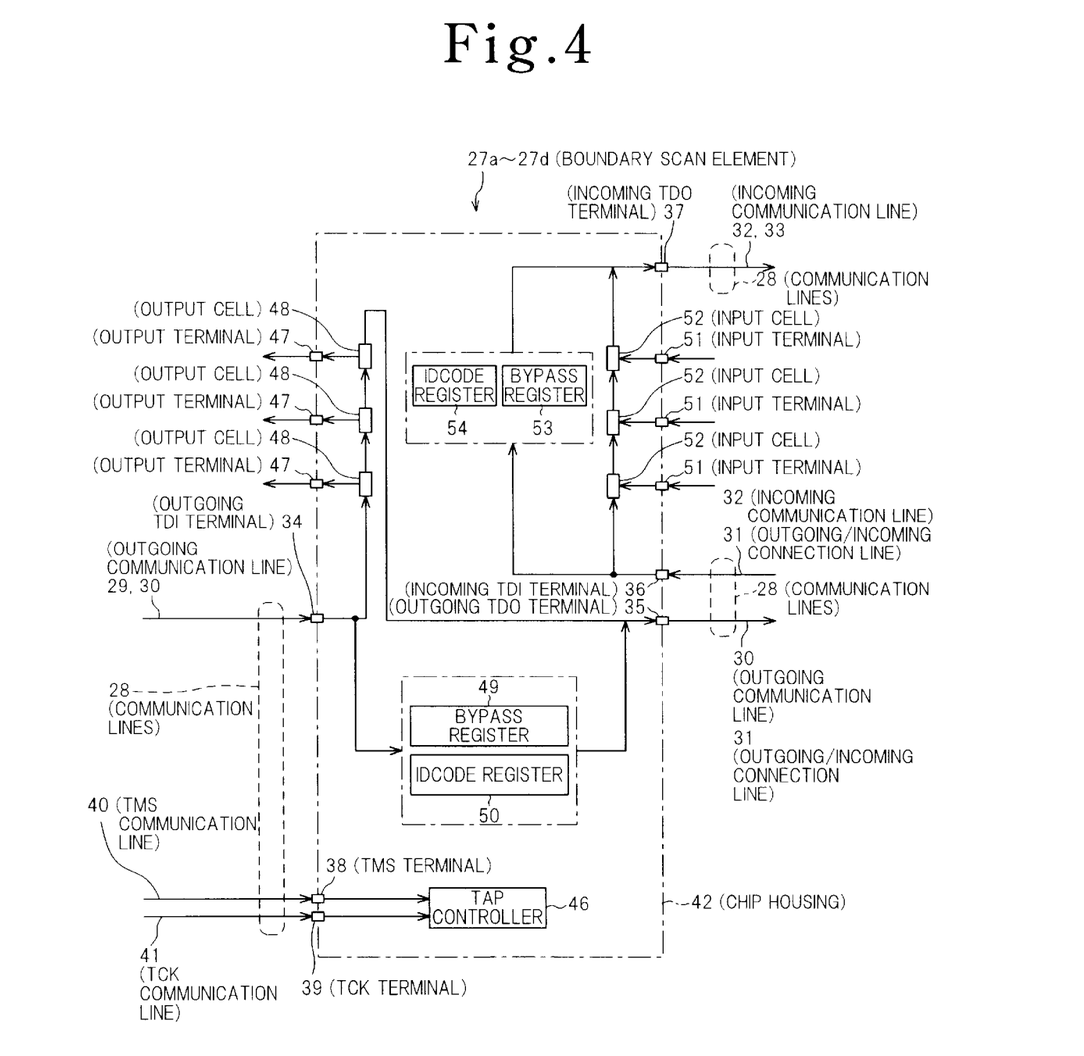
FIG. 4 is a block diagram of a boundary scan element 27a–27d.

As shown in FIG. 4, each of the boundary scan elements 27a–27d is incorporated into a chip housing 42 as a single package and, like the boundary scan elements 26a–26d shown in FIG. 2, includes output cells 48 provided corresponding to output terminals 47 and input cells 52 provided corresponding to input terminals 51, a TAP controller 46 for controlling input and output of data to the cells 48 and 52, TDI terminals 34 and 36 for receiving serial data, TDO terminals 35 and 37 for transmitting serial data, a TCK terminal 39 to which a clock signal is input, and a TMS terminal 38 for receiving a mode signal for switching the operation mode of the TAP controller 46, and is further provided with bypass registers 49 and 53, ID CODE registers 50 and 54 and the like as required.

However, each of the boundary scan elements 27a–27d has two TDI terminals and two TDO terminals, that is, an outgoing TDI terminal 34 and an incoming TDI terminal 36, and an outgoing TDO terminal 35 and an incoming TDO terminal 37. Moreover, in the case where the bypass registers and ID CODE registers are provided, they are disposed individually between the respective terminals as shown in FIG. 4.

In addition, the output cells 48 are connected between the outgoing TDI terminal 34 and the outgoing TDO terminal 35, and the input cells 52 are connected between the incoming TDI terminal 36 and the incoming TDO terminal 37.

Furthermore, as a special operation, like the boundary scan elements 26a–26d shown in FIG. 2, such boundary scan elements 27a–27d have an operation mode in which only either of the input cells 52 or the output cells 48 are driven into an operating state and the other are driven into a non-operating state, and have as well an operation mode in which providing two TDI terminals and two TDO terminals allows for driving both the input cells 52 and the output cells 48 into the operating state and allows input and output of mutually different data.

With such structure, the boundary scan elements 27a–27d allow high-speed transfer of test data at the time the boundary scan test method is executed. In addition to this, for example, the communication system 1b allows the input cells 52 to capture detection data or the like from the input terminals 51 while it simultaneously allows the output cells 48 to shift control data from the outgoing TDI terminal 34, or output the detection data or the like of the input cells 52 from the incoming TDO terminal 37 while it simultaneously allows the output cells 48 to output the control data to the output terminals 47.

In addition, in the communication system 1b, such boundary scan elements 27a–27d are connected in series to the communication controller unit 2.

Specifically, the output terminal 2a of the communication controller unit 2 is connected to the outgoing TDI terminal 34 of the boundary scan element 27a, one of those located at the both ends, via an outgoing communication line 29. The outgoing TDO terminal 35 of the boundary scan element 27a is connected to the outgoing TDI terminal 34 of the boundary scan element 27b via outgoing communication line 30. Likewise, the outgoing TDO terminal 35 and the outgoing TDI terminal 34 between the boundary scan elements 27b and 27c and between the boundary scan elements 27c and 27d are connected via the outgoing communication line 30.

In addition, the outgoing TDO terminal 35 of the boundary scan element 27d, the other one of those located at the both ends, is connected to the incoming TDI terminal 36 of the same boundary scan element 27d via an outgoing/incoming connection line 31, and the communication line is returned.

That is, the incoming TDO terminal 37 of the boundary scan element 27d is connected to the incoming TDI terminal 36 of the subsequent boundary scan element 27c via an incoming communication line 32. Likewise, the incoming TDO terminal 37 and the incoming TDI terminal 36 between the boundary scan elements 27c and 27b and between the boundary scan elements 27b and 27a are connected via an incoming communication line 32. Finally, the incoming TDO terminal 37 of the boundary scan element 27a and the input terminal 2b of the communication controller unit 2 are connected via an incoming communication line 33.

Therefore, the communication data output from the output terminal 2a of the communication controller unit 2 is transferred in sequence from the output cells 48 of the boundary scan element 27a to the output cells 48 of the respective boundary scan elements 27b–27d. If the data is shifted in this manner, the communication data would be input to the input cells 52 of the boundary scan element 27d via the outgoing/incoming connection line 31 and further transferred to the input cells 52 of the respective boundary scan elements 27c–27a and thus could be returned to the input terminal 2b of the communication controller unit 2.

The TCK terminal 39 or the TMS terminal 38 of each of the boundary scan elements 27a–27d is supplied with a clock signal or a mode signal from the communication controller unit 2 respectively. This allows the respective boundary scan elements 27a–27d to function in a synchronous manner. In addition, the input terminals 51 and the output terminals 47 of the respective boundary scan elements 27a–27d are connected to output terminals and input terminals (not shown) of the corresponding sensor units 4a–4d, so that the control data set to the output cells 48 is transmitted to the input terminals of the sensor units 4a–4d and the detection data or the like obtained by the sensor units 4a–4d is transmitted from the output terminals thereof to the input cells 52.

The configuration and functions of the sensor units 4a–4d and the communication controller unit 2 are the same as those of the communication system 1a mentioned above.

Now, the action of the communication system 1b configured in this manner will be explained.

Transmission of a command for driving the sensor units 4a–4d from the host computer unit 6 causes the communication controller unit 2 to prepare control data in response to the command. Then, the communication controller unit 2 transmits the mode signal from the TMS terminal 2c to switch the respective boundary scan elements 27a–27d to the operation mode required, and as well transmits the control data to the outgoing communication line 29, thereby allowing the control data to be set to the output cells 48 of the respective boundary scan elements 27a–27d. At this time, since the control data can be directly transferred from the outgoing TDI terminal 34 of each of the respective boundary scan elements 27a–27d to the output cells 48, the transfer time is short, which is the same as the communication system 1a of the present invention mentioned above.

Subsequently, the communication controller unit 2 outputs a mode signal indicating an output command for the communication data from the TMS terminal 2c, thereby allowing the control data set to the output cells 48 of the respective boundary scan elements 27a–27d to be transmitted to the corresponding sensor units 4a–4d.

The sensor units 4a–4d execute the measuring operation or monitoring operation in response to the contents of the control data received. Additionally, in accordance with the contents of the control data, the sensor units output measurement data, monitor data, or status data or the like of the sensor units 4a–4d themselves to the corresponding boundary scan elements 27a–27d.

Subsequently, transmission of a command for collecting the measurement data or the like of the sensor units 4a–4d and a new command for driving the sensor units 4a–4d from the host computer unit 6 causes the communication controller unit 2 to transmit the mode signal from the TMS terminal 2c to switch the respective boundary scan elements 27a–27d to the operation mode required. This allows detection data or the like such as measurement data to be set from the sensor units 4a–4d to the corresponding input cells 19 of the respective boundary scan elements 27a–27d. At this time in parallel with this, the communication controller unit 2 prepares control data in response to the new command.

Then, the communication controller unit 2 outputs, from the TMS terminal 2c, the mode signal indicating a transfer command for communication data of both the input cells 52 and the output cells 48. This causes the detection data or the like set to the input cells 52 of the respective boundary scan elements 27a–27d to be transferred to the input terminal 2b of the communication controller unit 2. Simultaneously, the new control data is transferred from the output terminal 2a of the communication controller unit 2 to be set to the output cells 48 of the respective boundary scan elements 27a–27d.

As mentioned above, the communication system 1b of the present invention employs the boundary scan elements 27a–27d of the present invention, thereby enabling simultaneous transfer or the like of mutually different communication data to the input cells 52 and output cells 48, and thus allowing the transfer rate of communication data to be more improved than by means of the aforementioned communication system 1a of the present invention.

Additionally, the communication system 1b can detect the occurrence of a break in communication lines 28 or a failure in the boundary scan elements or the like. For example, even in the case where a break has occurred in one of the communication lines 28 between the respective boundary scan elements 27a–27d, since the communication data of the input cells 52 of the boundary scan element(s) that is/are located closer to the communication controller unit 2 than the break point can be transmitted to the communication controller unit 2, the boundary scan element whose communication data is dropped off can be identified and thus the break point can be searched.

What is claimed is:

1. A communication system comprising:

boundary scan elements each having a plurality of input-terminal-side boundary cells connected in series and assigned individually to respective input terminals, a plurality of output-terminal-side boundary cells connected in series and assigned individually to respective output terminals, a TAP circuit for controlling input and output of data to or from said input-terminal-side and output-terminal-side boundary cells, TDI terminals for inputting serial data to be provided to said boundary cells, TDO terminals for outputting data from said boundary cells as serial data, a TCK terminal to which a clock signal is input, and a TMS terminal to which a mode signal is input to switch an operation mode of said TAP circuit, a plurality of terminal devices respectively connected to said boundary scan elements or having ICs into which the elements are incorporated, and a communication controller to which said boundary scan elements are connected in series and which transmits and receives communication data for controlling said terminal devices individually via said boundary scan elements, wherein each of said boundary scan elements has two of said TDI terminals and two of said TDO terminals, said input-terminal-side boundary cells in each boundary scan element are connected between one of said TDI terminals and one of said TDO terminals, and said output-terminal-side boundary cells in each boundary scan element are connected between the other of said TDI terminals and the other of said TDO terminals, and each of said boundary scan elements has an operation mode in which both the input-terminal-side boundary cells and the output-terminal-side boundary cells become operating states simultaneously, and in this condition, mutually different data can be input and output.

2. A communication system comprising:

boundary scan elements each having a plurality of input-terminal-side boundary cells connected in series and assigned individually to respective input terminals, a plurality of output-terminal-side boundary cells connected in series and assigned individually to respective output terminals, a TAP circuit for controlling input and output of data to or from said input-terminal-side and output-terminal-side boundary cells, TDI terminals for inputting serial data to be provided to said boundary cells, TDO terminals for outputting data from said boundary cells as serial data, a TCK terminal to which a clock signal is input, and a TMS terminal to which a mode signal is input to switch an operation mode of said TAP circuit, a plurality of terminal devices respectively connected to said boundary scan elements or having ICs into which the elements are incorporated, and a communication controller to which said boundary scan elements are connected in series and which transmits and receives communication data for controlling said terminal devices individually via said boundary scan elements, wherein said TDI terminals and said TDO terminals of each of said boundary scan elements comprise a first TDI terminal and a first TDO terminal connected respectively to opposite ends of said input-terminal-side boundary cells, and a second TDI terminal and a second TDO terminal connected respectively to opposite ends of said output-terminal-side boundary cells, said second TDI terminal of either one of said boundary scan elements located on the both ends is connected with a data output terminal of said communication controller, and said first TDO terminal thereof is connected with a data input terminal of said communication controller, and said second TDO terminal and said first TDI terminal of the other one of said boundary scan elements are connected.

3. A boundary scan element comprising:

a plurality of input-terminal-side boundary cells connected in series and assigned individually to respective input terminals, a plurality of output-terminal-side boundary cells connected in series and assigned individually to respective output terminals, a TAP circuit for controlling input and output of data to or from said input-terminal-side and output-terminal-side boundary cells, TDI terminals for inputting serial data to be provided to the boundary cells, TDO terminals for outputting data from the boundary cells as serial data, a TCK terminal to which a clock signal is input, and a TMS terminal to which a mode signal is input to switch an operation mode of the TAP circuit, wherein two of said TDI terminals and two of said TDO terminals are provided, said input-terminal-side boundary cells are connected between either one of said TDI terminals and either one of said TDO terminals, and said output-terminal-side boundary cells are connected between the other one of said TDI terminals and the other one of said TDO terminals.

* * * * *